(12) United States Patent
Tuominen (10) Patent No.: US 7,732,909 B2
(45) Date of Patent: Jun. 8, 2010

(54) METHOD FOR EMBEDDING A COMPONENT IN A BASE

(75) Inventor: Risto Tuominen, Helsinki (FI)

(73) Assignee: Imbera Electronics Oy, Espoo (FI)

( * ) Notice: Subject to any disclaimer, the term of this patent is extended or adjusted under 35 U.S.C. 154(b) by 313 days.

(21) Appl. No.: 11/797,609

(22) Filed: May 4, 2007

(65) Prior Publication Data
US 2007/0206366 A1    Sep. 6, 2007

Related U.S. Application Data

(63) Continuation of application No. 10/502,336, filed on Sep. 23, 2004, now Pat. No. 7,294,529.

(51) Int. Cl.
| | |
|---|---|
| H01L 21/52 | (2006.01) |
| H01L 21/60 | (2006.01) |
| H01L 23/055 | (2006.01) |
| H01L 23/08 | (2006.01) |

(52) U.S. Cl. .................. 257/687; 257/693; 257/702; 257/723; 257/E23.5; 257/E21.505
(58) Field of Classification Search .............. 438/107, 438/125, 126, FOR. 375, FOR. 379; 257/E21.5, 257/E21.505
See application file for complete search history.

(56) References Cited

U.S. PATENT DOCUMENTS

| | | | | |
|---|---|---|---|---|
| 4,246,595 | A | | 1/1981 | Noyori et al. |
| 5,102,829 | A | * | 4/1992 | Cohn .................. 29/837 |
| 5,162,613 | A | | 11/1992 | Schoenthaler |
| 5,208,188 | A | | 5/1993 | Newman |
| 5,216,806 | A | | 6/1993 | Lam |
| 5,227,338 | A | * | 7/1993 | Kryzaniwsky .......... 29/841 |
| 5,248,852 | A | | 9/1993 | Kumagai |
| 5,497,033 | A | | 3/1996 | Fillion et al. |

(Continued)

FOREIGN PATENT DOCUMENTS

JP    2002-016327 A    1/2002

OTHER PUBLICATIONS

Patent Abstracts of Japan, vol. 2002, No. 5, May 3, 2002.

*Primary Examiner*—George Fourson
(74) *Attorney, Agent, or Firm*—Birch, Stewart, Kolasch & Birch, LLP (57) ABSTRACT

A method, in which the semiconductor components forming part of an electronic circuit, or at least some of them, are embedded in a base, such as a circuit board, during the manufacture of the base, when part of the base structure is, as it were, manufactured around the semiconductor components. Through-holes for the semiconductor components are made in the base, in such a way that the holes extend between the first and second surface of the base. After the making of the holes, a polymer film is spread over the second surface of the base structure, in such a way that the polymer film also covers the through-holes made for the semiconductor components from the side of the second surface of the base structure. Before the hardening, or after the partial hardening of the polymer film, the semiconductor components are placed in the holes made in the base, from the direction of the first surface of the base. The semiconductor components are pressed against the polymer film in such a way that they adhere to the polymer film.

33 Claims, 12 Drawing Sheets

U.S. PATENT DOCUMENTS

| | | |
|---|---|---|
| 5,637,919 A | 6/1997 | Grabbe |
| 5,970,321 A * | 10/1999 | Hively ........................ 438/123 |
| 6,015,722 A * | 1/2000 | Banks et al. ................. 438/108 |
| 6,038,133 A | 3/2000 | Nakatani et al. |
| 6,100,108 A * | 8/2000 | Mizuno et al. ................. 438/51 |
| 6,154,366 A | 11/2000 | Ma et al. |
| 6,271,469 B1 | 8/2001 | Ma et al. |
| 6,284,564 B1 | 9/2001 | Balch et al. |
| 6,292,366 B1 | 9/2001 | Platt |
| 6,475,877 B1 | 11/2002 | Saia et al. |
| 6,489,685 B2 | 12/2002 | Asahi et al. |
| 6,495,394 B1 * | 12/2002 | Nakata et al. ................. 438/107 |
| 6,521,530 B2 * | 2/2003 | Peters et al. ................. 438/667 |
| 6,537,848 B2 | 3/2003 | Camenforte et al. |
| 6,538,210 B2 | 3/2003 | Sugaya et al. |
| 6,607,943 B1 * | 8/2003 | Kinsman ..................... 438/124 |
| 6,710,458 B2 | 3/2004 | Seko et al. |
| 6,790,712 B2 | 9/2004 | Bai et al. |
| 6,979,596 B2 | 12/2005 | Corisis et al. |
| 2001/0054758 A1 * | 12/2001 | Isaak .......................... 257/686 |
| 2002/0020898 A1 * | 2/2002 | Vu et al. ...................... 257/676 |
| 2002/0063342 A1 * | 5/2002 | Blackshear ................. 257/787 |
| 2002/0117743 A1 | 8/2002 | Nakatani et al. |
| 2002/0127770 A1 * | 9/2002 | Vaiyapuri ................... 438/107 |
| 2002/0185303 A1 | 12/2002 | Takeuchi et al. |
| 2003/0068852 A1 | 4/2003 | Towle et al. |
| 2003/0100142 A1 | 5/2003 | Shin et al. |
| 2003/0137045 A1 | 7/2003 | Sugaya et al. |
| 2004/0266067 A1 | 12/2004 | Bai |
| 2005/0285244 A1 | 12/2005 | Chen |
| 2006/0105500 A1 | 5/2006 | Chang |

\* cited by examiner

METHOD FOR EMBEDDING A COMPONENT IN A BASE

This application is a Continuation of application Ser. No. 10/502,336, filed on Sep. 23, 2004 now U.S. Pat. No. 7,294,529, the entire contents of which are hereby incorporated by reference and for which priority is claimed under 35 U.S.C. §120.

The present invention relates to a method for embedding one or more components in a base.

The bases that are processed using the methods to which the present invention relates are used as bases for electrical components, typically semiconductor components and particularly microcircuits, in electronic products. The task of the base is to provide a mechanical attachment base for the components and the necessary electrical connections to the other components on the base and outside the base. The base can be a circuit board, so that the method that is the object of the invention is closely related to circuit-board manufacturing technology. The base can also be some other base, for example, a base used for packaging a component or components, or the base of an entire functional module.

Circuit-board manufacturing technologies differ from microcircuit manufacture in, among other things, the fact that the substrate used in microcircuit manufacturing technologies is a semiconductor material, whereas the base material of a circuit board is an insulator. Microcircuit manufacturing technologies are also typically considerably more expensive than circuit-board manufacturing technologies.

Circuit-board manufacturing technologies differ from packaging techniques in that packaging techniques are intended to form a package around a semiconductor component, which will facilitate its handling. The surface of a package of a semiconductor component has contact parts, typically protrusions, which allow the packaged component to be easily installed on a circuit board. A semiconductor package also contains conductors, through which voltage can be connected to the actual semiconductor, connecting the protruding contact parts outside the package to the contact areas on the surface of the semiconductor component.

However, the packages of components manufactured using conventional technologies take up a considerable amount of space. The miniaturization of electronic devices has led to an attempt to eliminate the packaging of semiconductor components. For this purpose, the so-called flip-chip technology for instance, has been developed, in which a semiconductor component without a package is assembled directly onto the surface of the circuit board. There are, however, many difficulties in flip-chip technology. For example, problems can arise with the reliability of connections, especially in applications in which mechanical stresses arise between the circuit board and the semiconductor component. Mechanical stresses must be evened by adding a suitable underfill between the chip and the circuit board. This procedure slows down the process and increases manufacturing costs. Stresses arise particularly in applications in which a flexible circuit board is used and the circuit board is flexed strongly.

Object of the invention is to create a method, by means of which unpacked microcircuits can be embedded to a base reliably but economically.

The invention is based on embedding the semiconductor components, or at least some of them, in a base, such as a circuit board, during the manufacture of the board, whereby part of the base structure is, as it where, manufactured around the semiconductor components. According to the invention, feed-throughs for semiconductor components are made in the base in such a way that the holes extend between the first and second surfaces of the base. After the holes have been made, a polymer film is spread over the second surface of the base structure in such a way that the polymer film also covers the feed-throughs made for the semiconductor components, from the second side of the base structure. Before the hardening of the polymer film, or after partial hardening, the semiconductor components are placed, from the direction of the first side of the base, in the holes that have been made. The semiconductor components are pressed against the polymer film so that they adhere to the polymer film. After this, the final hardening of the polymer film is carried out. According to the invention, a conductive pattern is made in the base, before a component is placed in the holes, and the component is placed in the hole in such a way that the component is aligned in relation to the conductive patterns made on the baseboard.

More specifically, the method according to the invention is characterized by what is stated in the characterizing portion of Claim 1.

Considerable advantages are gained with the aid of the invention. This is because, with the aid of the invention, a circuit board can be manufactured with the semiconductor components embedded inside it. The invention also makes it possible to manufacture a small and reliable component package around a component.

The invention also permits a large number of embodiments, which provide significant additional advantages.

For example, with the aid of preferred embodiments of the invention, the component's packaging stage, the circuit board's manufacturing stage, and the assembly and contact-making stage of the semiconductor components can be combined to form a single totality. The combination of the various process stages brings important logistic benefits and permits the manufacture of a smaller and more reliable electronic module. There is the further advantage that such a manufacturing method can largely exploit circuit board manufacturing and assembly technologies that are in general use.

According to a preferred embodiment of the invention, the totality of the composite process is simpler than, for example, using flip-chip technology to manufacture a circuit board and attach the components to the circuit board. By means of such preferred embodiments, the following advantages over the conventional solution are obtained:

Soldering is not required to form contacts with the components, instead an electrical contact can be manufactured by growing conductors on top of the contact areas of a semiconductor component. This means that there is no need to use molten metal to connect the components, so that compounds are not formed between metals. Compounds between metals are generally brittle, so that reliability is improved compared to connections made by soldering. Particularly in small connections, the brittleness of the metal compounds in the connections causes great problems. According to a preferred embodiment, it is possible to achieve clearly smaller structures in a solderless solution than in soldered solutions. The solderless contact-making method also has the advantage that high temperatures are not required to form contacts. A lower process temperature permits greater choice when selecting other materials of the circuit board, the component package, or the electronics module. In the method, the temperature of the circuit board, the component, and the conductive layer directly connected to the component can be kept in the range 20-85° C. Higher temperatures, for example, of about 150° C., may be needed only when curing (polymerizing) the polymer films used. However, the temperature of the baseboard and the components can be kept under 200° C. during the entire process. If the method employs polymer films that are hardened in other ways than due to the effect of a high temperature, for example, chemically, or by electromagnetic radiation, the temperature of the baseboard and the components can, in a preferred embodiment, be kept under 100° C. during the entire process.

Because the use of the method permits the manufacture of smaller structures, the components can be spaced more closely. The conductors between the components can then also be shorter while the electrical properties of the electronic circuit improve, for example, by reducing losses, interference, and delay times.

The method also permits the manufacture of three-dimensional structures, as the bases and the components embedded in the bases can be assembled on top of each other.

In the method, it is also possible to reduce the interfaces between different metals.

The method permits a lead-free process.

The invention also permits other preferred embodiments. In connection with the invention, flexible circuit boards, for instance, can be used. Further, the process permits circuit boards to be assembled on top of each other.

With the aid of the invention, it is also possible to manufacture extremely thin structures, in which the semiconductor components are, despite its thinness, entirely protected within a base, such as a circuit board.

Because the semiconductor components can be placed entirely inside the circuit board, the joints between the circuit board and the semiconductor components are mechanically durable and reliable.

In the following, the invention is examined with the aid of examples and with reference to the accompanying drawings.

Figure 1A:
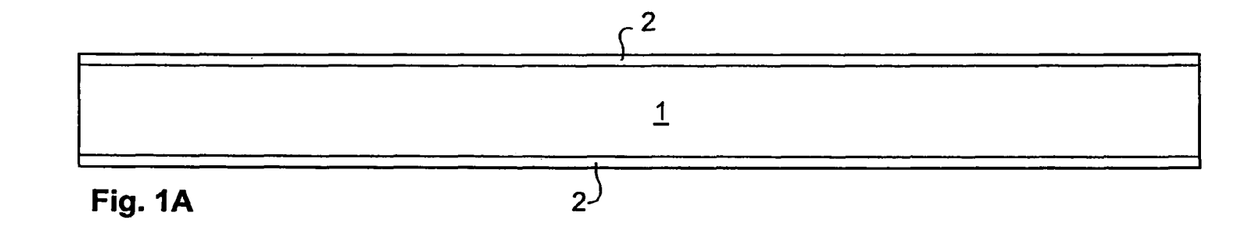
FIG. 1 shows a series of cross-sections of one process according to the invention.

The series of illustrations shown in FIG. 1 show one possible process according to the invention. In the following, the process of FIG. 1 is examined in stages:

Stage A (FIG. 1A):

In stage A, a suitable baseboard 1 is selected for the circuit-board manufacturing process. The baseboard 1 can be, for example, a glass-fibre reinforced epoxy board, such as an FR4-type board. In the example process, the baseboard 1 can thus be an organic board, as the example process does not require high temperatures. A flexible and cheap organic board can thus be selected for the baseboard 1. Typically a board that is already coated with a conductive material 2, usually copper, is selected for the baseboard 1. Of course, an inorganic board can also be used.

Figure 1B:
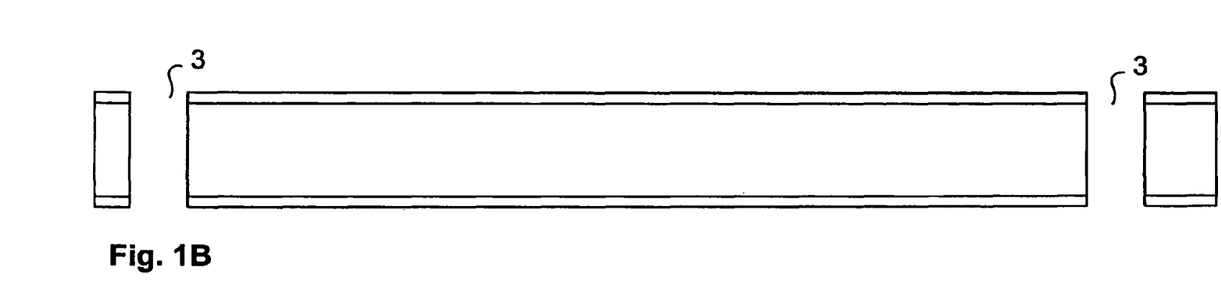

Stage B (FIG. 1B):

In stage B, through holes 3 are made in the baseboard for electrical contacts. The holes 3 can be made, for example, with some known method used in circuit-board manufacture, such as mechanical drilling.

Figure 1C:
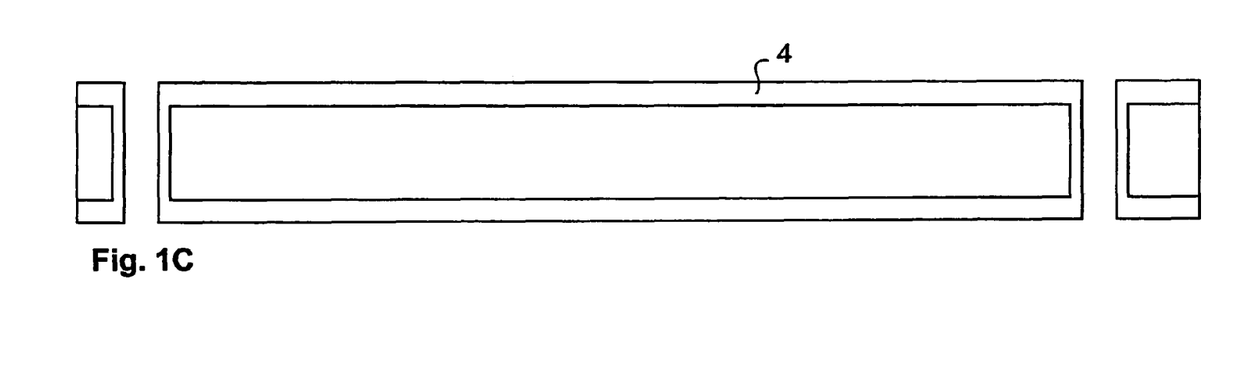

Stage C (FIG. 1C):

In stage C, metal is grown into the through holes made in stage B. In the example process, the metal 4 is also grown on top of the circuit board, thus also increasing the thickness of the conductive layer 2.

The conductive material 4 to be grown is copper, or some other material with sufficient electrical conductivity. Copper metallizing can take place by coating the holes with a thin layer of chemical copper and then continuing the coating using an electrochemical copper-growing method. Chemical copper is used in the example, as it will also surface on top of a polymer and act as an electrical conductor in electrochemical coating. The metal can thus be grown using a wet-chemical method, so that the growth is cheap. Alternatively, the conductive layer 4 can be made, for example, by filling the through holes with an electrically conductive paste.

Figure 1D:
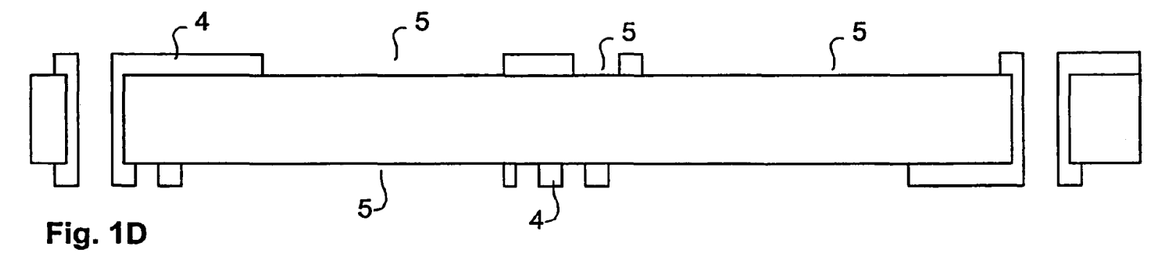

Stage D (FIG. 1D):

In stage D, the conductive layer on the surface of the circuit board is patterned. This can be done by utilizing generally known circuit-board manufacturing methods. The patterning of the conductive layer is aligned, for example, on the holes made in stage B.

The manufacture of the conductor pattern can take place, for example, by laminating, on the surface of the metal 4, a photolithographic polymer film, on which the desired conductive pattern is formed by directing light through a patterned mask. After exposure, the polymer film is developed, when the desired areas are removed from it and the copper 4 under the polymer is revealed. Next, the copper revealed under the film is etched away, leaving the desired conductive pattern. The polymer acts as a so-called etching mask and openings 5, at the foot of which the baseboard of the circuit board is revealed, are formed in the metal layer 4. After this, the polymer film is also removed from on top of the copper 4.

Figure 1E:
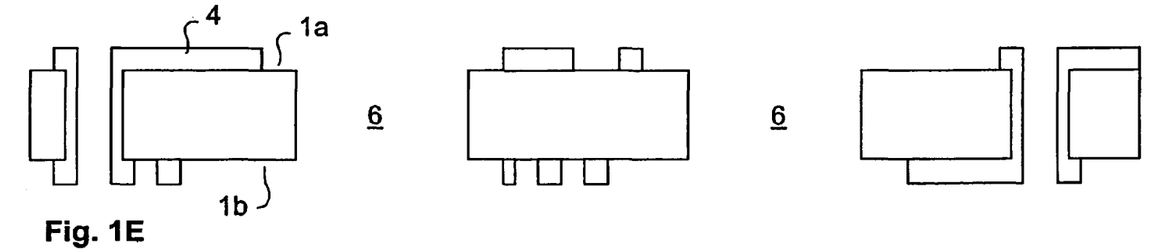

Stage E (FIG. 1E):

In stage E, holes 6 are made in the baseboard for the microcircuits. The holes extend through the entire baseboard, from the first surface 1a to the second surface 1b. The holes may be made, for example, mechanically milling by means of a milling machine. The holes 6 can also be made, for example, by stamping. The holes 6 are aligned relative to the conductive patterns 4 of the circuit board. The holes 3 made during stage B can also be used to aid alignment, but then too the alignment is relative to the conductive patterns 4, as the conductive patterns 4 have a specific position in relation to the holes 3.

Figure 1F:
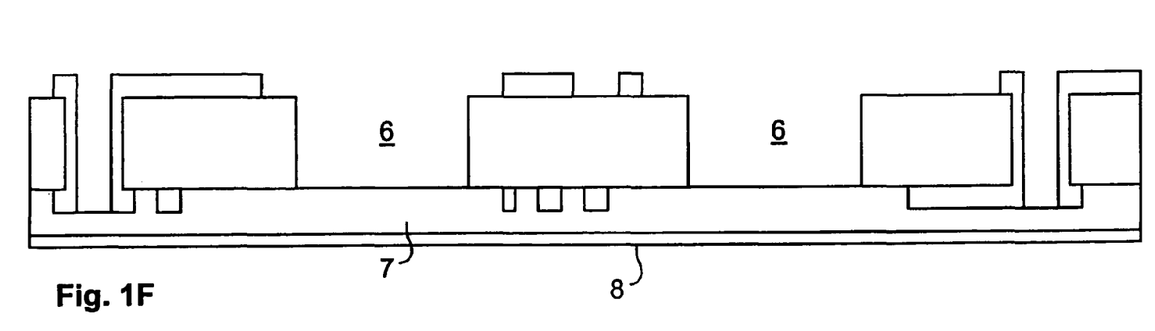

Stage F (FIG. 1F):

In stage F, a polymer film 7 forming an electrical insulation is made on the second surface 1b of the baseboard and over the holes 6. The polymer film 7 is made in such a way that it is sufficiently rigid to retain the main features of its shape, but, however, not hardened, so that components can be attached by pressing them into the film. The polymer film should also be sufficiently rigid to be able to hold the components pressed into the film essentially immovable in relation to the base, during the following process stages.

The polymer film made in Stage F can be, for example, a pre-preg-type film.

If desired, a metal coating 8 can also be made on top of the polymer film 7 in stage F.

In the example process, stage F is carried out by laminating a thin polymer film (e.g., c. 40 µm) on the surface of the circuit board, on top of which is a layer of copper (e.g., c. 5 µm). Lamination takes place with the aid of pressure and heat. In the example process, the film is thus an RCC (Resin Coated Copper) foil. The lamination must then be carried out to be uncompleted, so that the polymer is not completely hardened. This is achieved by setting the laminating temperature sufficiently low and/or by shortening the duration of the heat treatment.

Figure 1G:
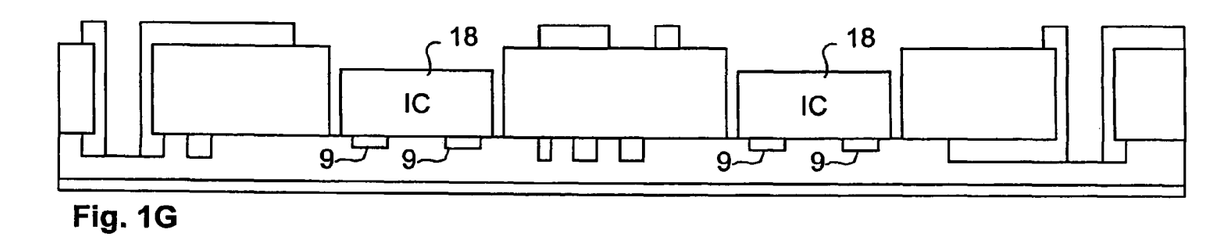

Stage G (FIG. 1G):

In stage G, the microcircuits 18 are assembled in the holes 6, from the side of the first surface 1a of the baseboard. Assembly can take place using a precision assembly machine, the microcircuits 18 being aligned relative to the conductive patterns of the circuit board. As in stage E, the holes made in stage B can be used to aid alignment.

The microcircuits 18 are assembled in such a way that they adhere to polymer film 7 in the 'bottoms' of the holes 6. The most suitable way to carry out assembly is to use such a force that the microcircuits 18 push slightly inside the polymer film 7, so that the microcircuits are made to remain in place better. It is also advantageous to the process, if the microcircuits being assembled have contact protrusions 9, which penetrate inside the polymer film 7.

Figure 3:
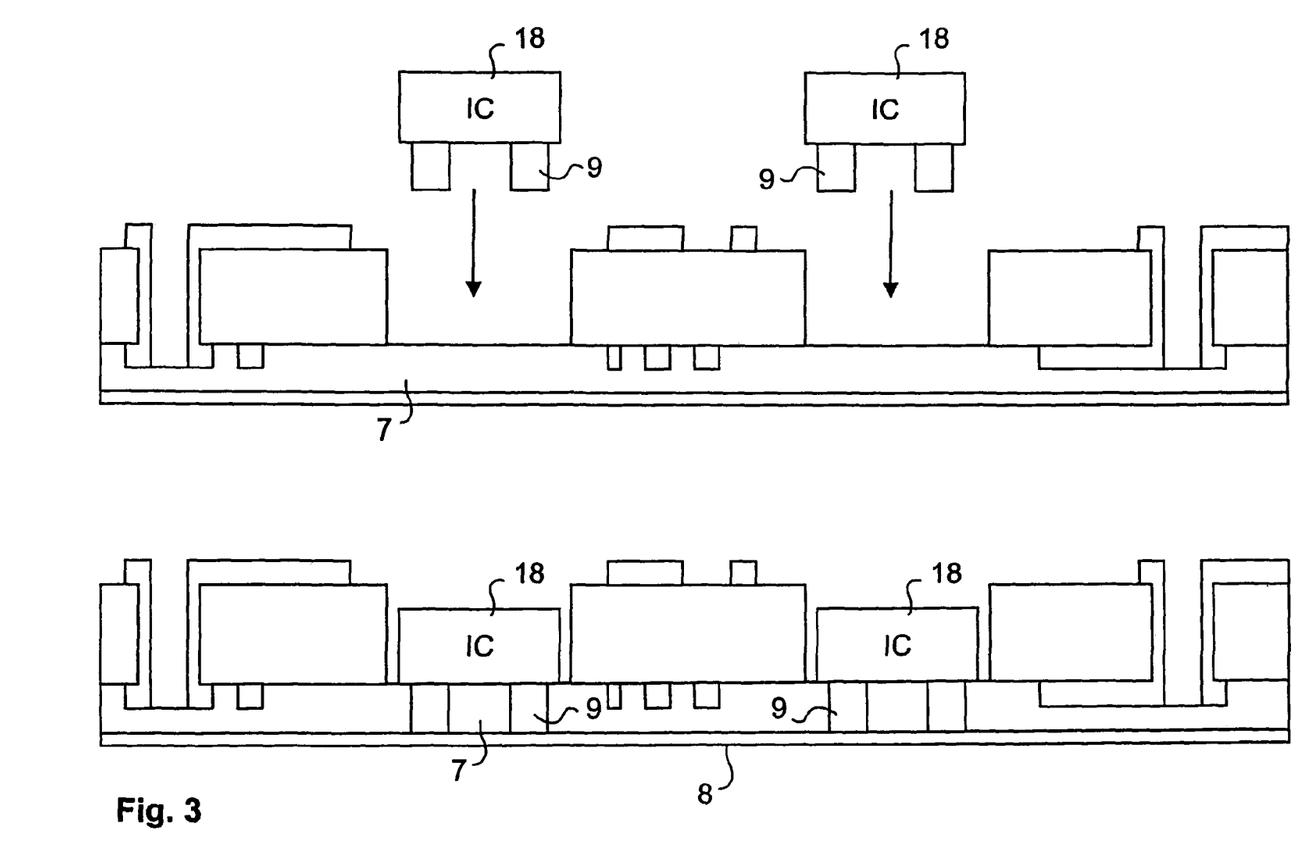
FIG. 3 shows a schematic diagram of one possible contact-forming method.

FIG. 3 shows an interesting alternative embodiment, in which the contact protrusions 9 of the microcircuits are so long that they extend right through the polymer film 7 to the metal coating 8. In that case, there is no need to make holes in the polymer film 7 (Stage K) for making contacts in the microcircuits, as the holes are formed in connection with the assembly of the components. In addition, the metallizing stage (Stage L) of the holes can be simplified, as the contact protrusions 9 automatically form conductor columns through the polymer film 7. In the embodiment of FIG. 3, the contact protrusions can also be given a sharp shape, so that their penetration ability improves. If the contact protrusions 9 are sufficiently long and sharp, they can also penetrate the metal coating 8 and in principle form an electrical contact between the microcircuit 18 and the metal coating 8.

Stage H (not shown):

In stage H, the polymer film 7 is hardened with the aid of curing. Curing generally comprises a heat treatment, but the process can also employ some treatment other than heat to harden the polymer. If desired, stage H can also be omitted, particularly in connection with polymers cured by heat treatment. However, hardening the polymer at this stage prevents the microcircuit from moving relative to the base during stage I.

Figure 1I:
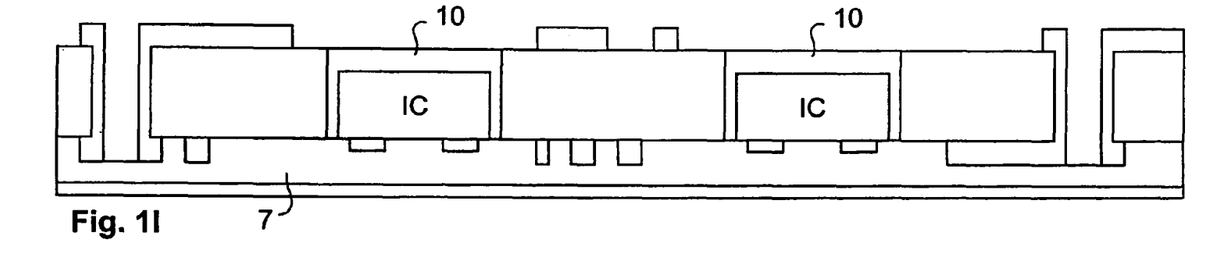

Stage I (FIG. 1I):

In stage I, the microcircuits are secured to the baseboard of the circuit board by filling the holes made for the microcircuits with a filler material 10. In the example process, this stage is carried out by spreading casting epoxy into the holes from the first surface (1a) of the circuit board and on top of the microcircuits. The epoxy is smoothed with a spatula and hardened by curing in an autoclave. At the same time, the polymer film 7 is also hardened, if the process does not include stage H.

Figure 1J:
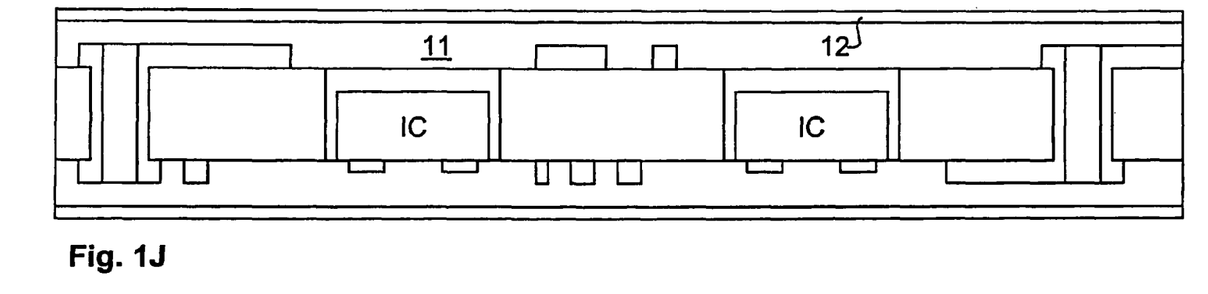

Stage J (FIG. 1J):

In stage J, a polymer film 11 is formed on the first surface (1a) of the circuit board, followed by a thin metal coating 12 on top of the polymer film.

In the example process, stage J is carried out by laminating a thin polymer film (e.g., c. 40 µm) on the surface of the circuit board, on top of which is a layer of copper (e.g., c. 5 µm). Lamination takes place with the aid of pressure and heat. In the example process, the film is thus an RCC (Resin Coated Copper) foil.

The polymer film can also be made by, for example, spreading polymer in a liquid form on the circuit board. Thus lamination is not essential in stage J. What is essential is that an insulating layer, typically a polymer film, is made on the circuit board, which contains the embedded components, particularly embedded microcircuits. The polymer film itself can be, according to the embodiment, a filled or unfilled polymer film. The polymer film can also be coated with metal, but this is not essential, as the conductive surface can also be made later, on top of a polymer layer that is already attached to the circuit board.

Stage J makes it possible to use conventional manufacturing methods and work stages used in circuit board manufacture in the example process and nevertheless to be able to bury microcircuits and other components inside the circuit board.

Figure 1K:
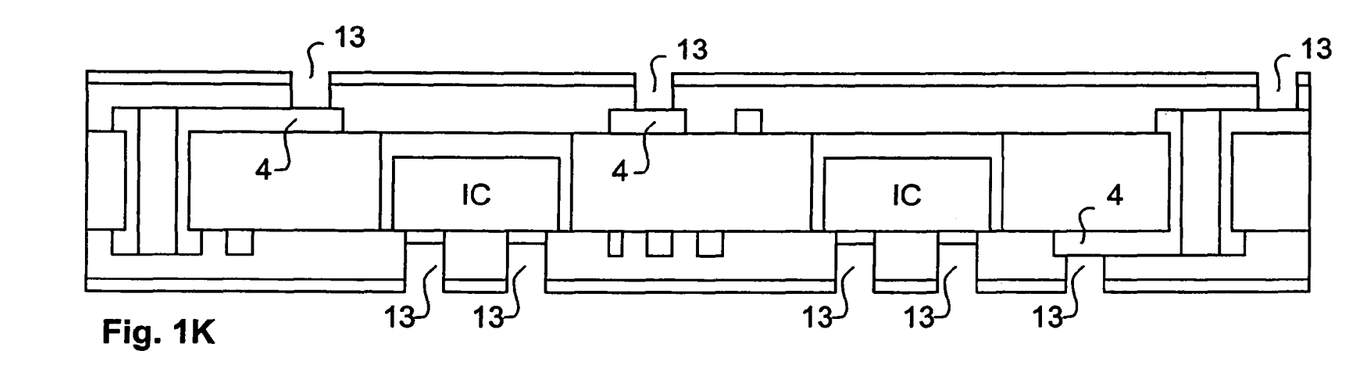

Stage K (FIG. 1K)

In stage K, holes 13 are made in the polymer films 7 and 11 (and at the same time in the conductive foils 8 and 12), through which it is possible to create contacts with the conductive patterns and feed-throughs (conductive material 4) of the circuit board and with the microcircuits.

The holes 13 can be made, for example, using a laser, or some other suitable method. The conductive patterns made in stage D, or the through holes made in stage B can be used for alignment.

Figure 1L:
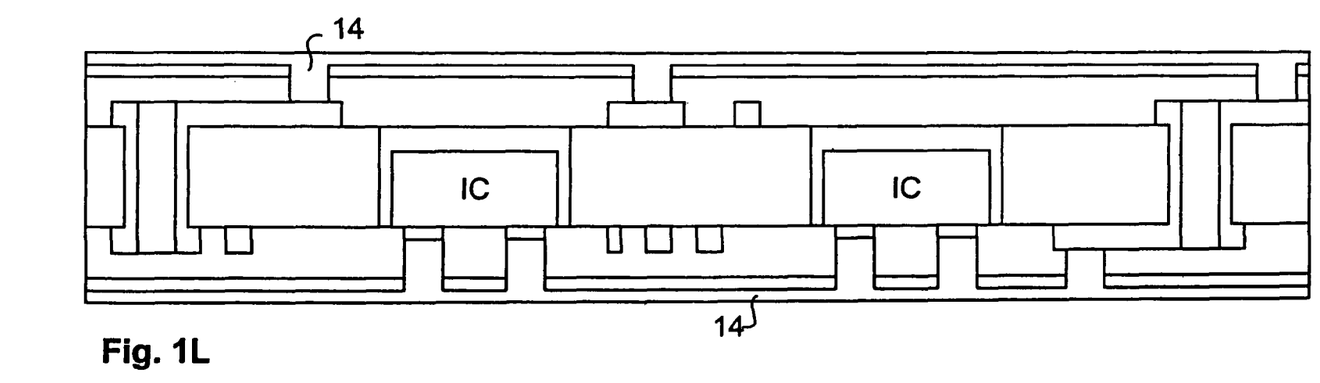

Stage L (FIG. 1L):

Stage L corresponds to stage C. In stage L, a conductive layer 14 is made in the holes 13 and on the surfaces of the circuit board.

In the example process, the feed-throughs (holes 13) are first of all cleaned using a three-stage desmear treatment. After this, the feed-throughs are metallized by first forming a catalysing SnPd surface on the polymer and after that depositing a thin layer (about 2 Fm) of chemical copper onto the surface. The thickness of the copper 14 is increased by electrochemical deposition.

Alternatively, the feed-throughs can be filled with an electrically conductive paste or made using some other suitable micro-via metallizing method.

Figure 1M:
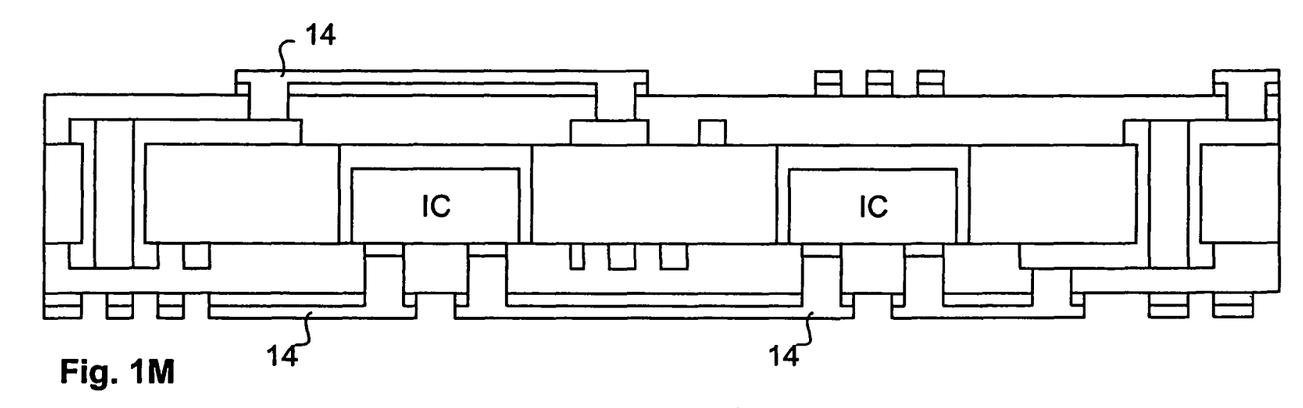

Stage M (FIG. 1M):

In stage M, a conductive pattern is formed in the same way as in stage D.

Figure 1N:
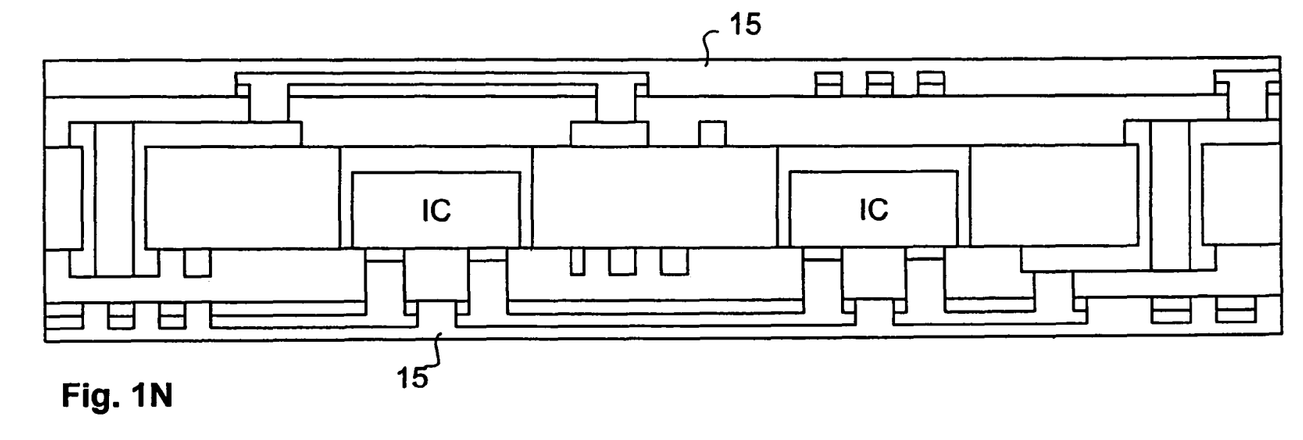
Figure 1O:
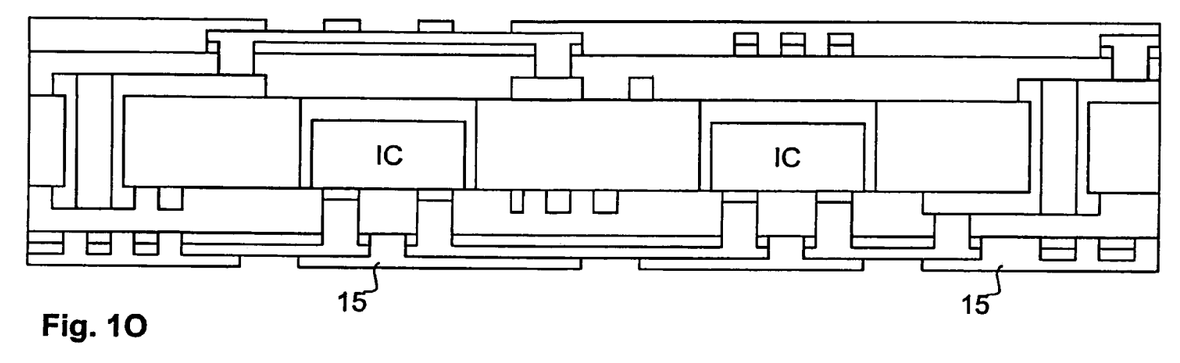

Stages N and O (FIGS. 1N and 1O):

In stages N and O, a photolithographic polymer 14 is spread on the surface of the circuit board and the desired pattern is formed in the polymer 14 (in a manner similar to that in stages D and M). The exposed polymer film is developed, but the polymer film pattern remaining on the circuit board is not removed.

Figure 1P:
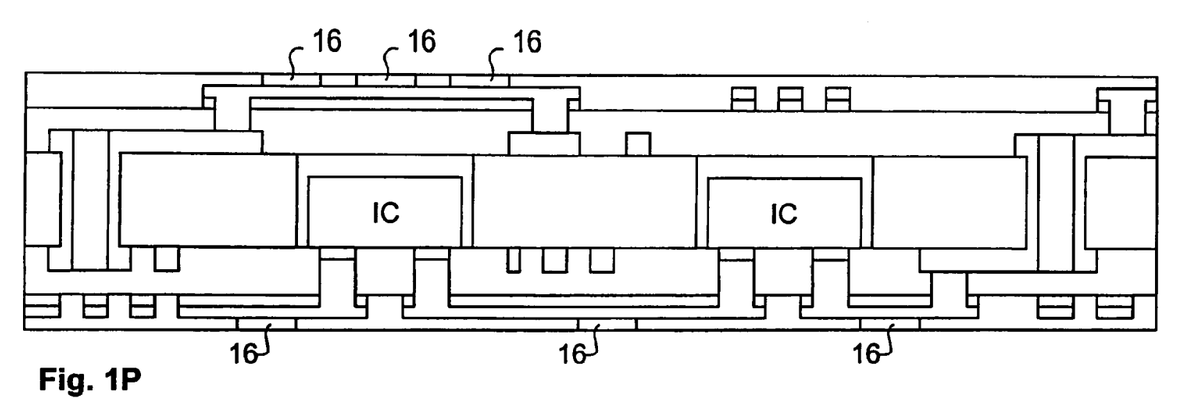

Stage P (FIG. 1P):

In stage P, the connection areas of the polymer film pattern formed in the previous stage are coated 16. The coating 16 can be made with, for example, a Ni/Au coating, or an OSP (organic surface protection).

The example of FIG. 1 depicts one process, which can be used to exploit our invention. Our invention is thus in no way restricted to the process described above, but instead the invention covers a large group of different process and their end products, to the full extent of the Claims and allowing for equivalency interpretations. In particular, the invention is in no way restricted to the layout shown in the example, instead it will be obvious to one versed in the art that the processes according to our invention can be used to manufacture many kinds of circuit boards, which differ greatly from the examples disclosed here. Thus, the microcircuits and connections of the figures are only shown to illustrate the manufacturing process.

A great many changes can thus be made to the process of the example disclosed above, without nevertheless deviating from the idea according to the invention. The changes can relate to the manufacturing techniques depicted in the various stages, or, for example, to the mutual sequence of the stages. For example, stage B can equally well be carried out after stage D, i.e. the procedure can be to align the drill on the pattern, instead of aligning the pattern on the drilled holes. Correspondingly, the order of stages D and E can also be reversed. The component holes 6 are then made before the conductive patterns are formed. In that case, the conductive pattern is aligned relative to the holes 6 (and also the holes 3). Irrespective of the order in which stages B, D, and E are carried out, the polymer film 7 to be made in stage F covers the holes 6 and the conductive pattern formed on the second surface 1*b* of the baseboard.

Stages that are felt to be required can also be added to the process of the example disclosed above. For example, a foil that protects the surface of the circuit board during the casting taking place in stage H can be laminated onto the first side (1*a*) of the circuit board. Such a protective foil is manufactured so that it covers all the other areas except for the holes 6. The protective foil keeps the surface of the circuit board clean when the casting epoxy is spread with the spatula. The protective foil can be made in a suitable stage before stage I and removed from the surface of the circuit board immediately after the casting.

With the aid of the method, it is also possible to manufacture component packets to be attached to the circuit board. Such packets can also include several semiconductor components, which are connected electrically to each other.

The method can also be used to manufacture entire electrical modules. The process shown in FIG. 1 can also be applied in such a way that the conductive structure is made only on the second side (1*b*) of the circuit board, to which the contact surfaces of the microcircuit are oriented.

The method makes it possible to manufacture, for example, circuit boards or electrical modules, in which the thickness of the baseboard used is in the range 50-200 microns and the thickness of the microcircuit and microcircuits is in the range 50-150 microns. The pitch of the conductors can vary, for example, in the range 50-250 microns while the diameter of the micro-feed-throughs can be, for example, 15-50 microns. Thus, the total thickness of a single board in a one-layer construction will be about 100-300 microns.

The invention can also be applied in such a way that circuit boards are assembled on top of each other, thus forming a multi-layer circuit structure, in which there are several circuit boards manufactured according to FIG. 1 set on top of each other and connected electrically to each other. The circuit boards set on top of each other can also be circuit boards in which the conductive structure is formed only on the second side 1*b* of the circuit board, but which nevertheless include feed throughs, through which an electrical contact can also be formed to the microcircuits from the first side of the circuit board. FIG. 2 shows one such process.

FIG. 2 shows the connection of circuit boards to each other. In the following, the process is described in stages.

Figure 2A:
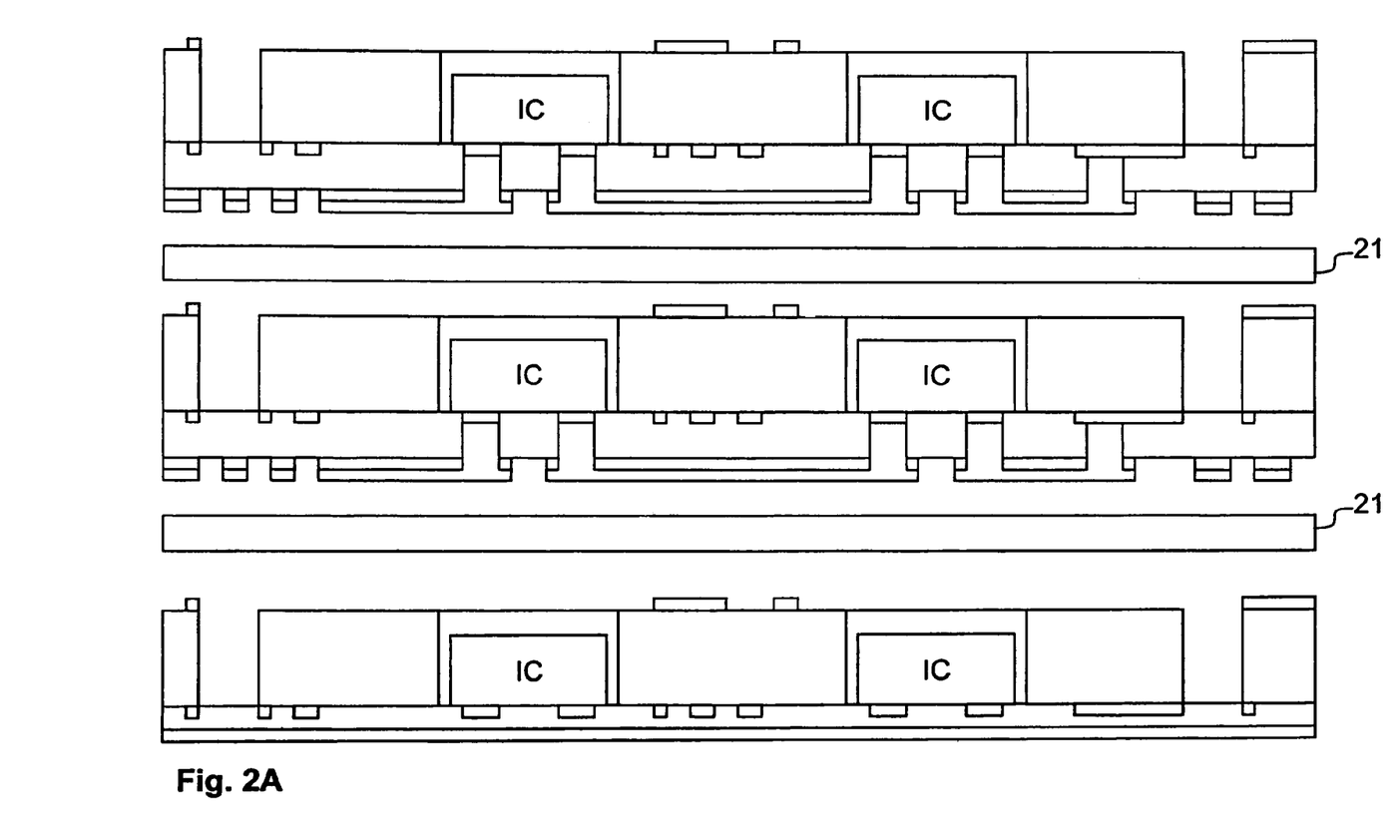
FIG. 2 shows a series of cross-sections of a second process according to the invention.

Stage 2A (FIG. 2A):

Stage 2A depicts the circuit boards being set on top of each other. The lowest circuit board can be obtained, for example, after stage J of a modified process of FIG. 1. In this case, the process of FIG. 1 is then modified by omitting stage 1C.

The middle and upper circuit boards in turn can be obtained after stage M of a modified process of FIG. 1, for instance. In this case, the process of FIG. 1 is modified by omitting stage 1C and performing stages J, K, and L on only the second side (1*b*) of the circuit board.

In addition to the circuit boards, FIG. 2A also shows pre-preg epoxy layers 21 placed between the circuit boards.

Figure 2B:
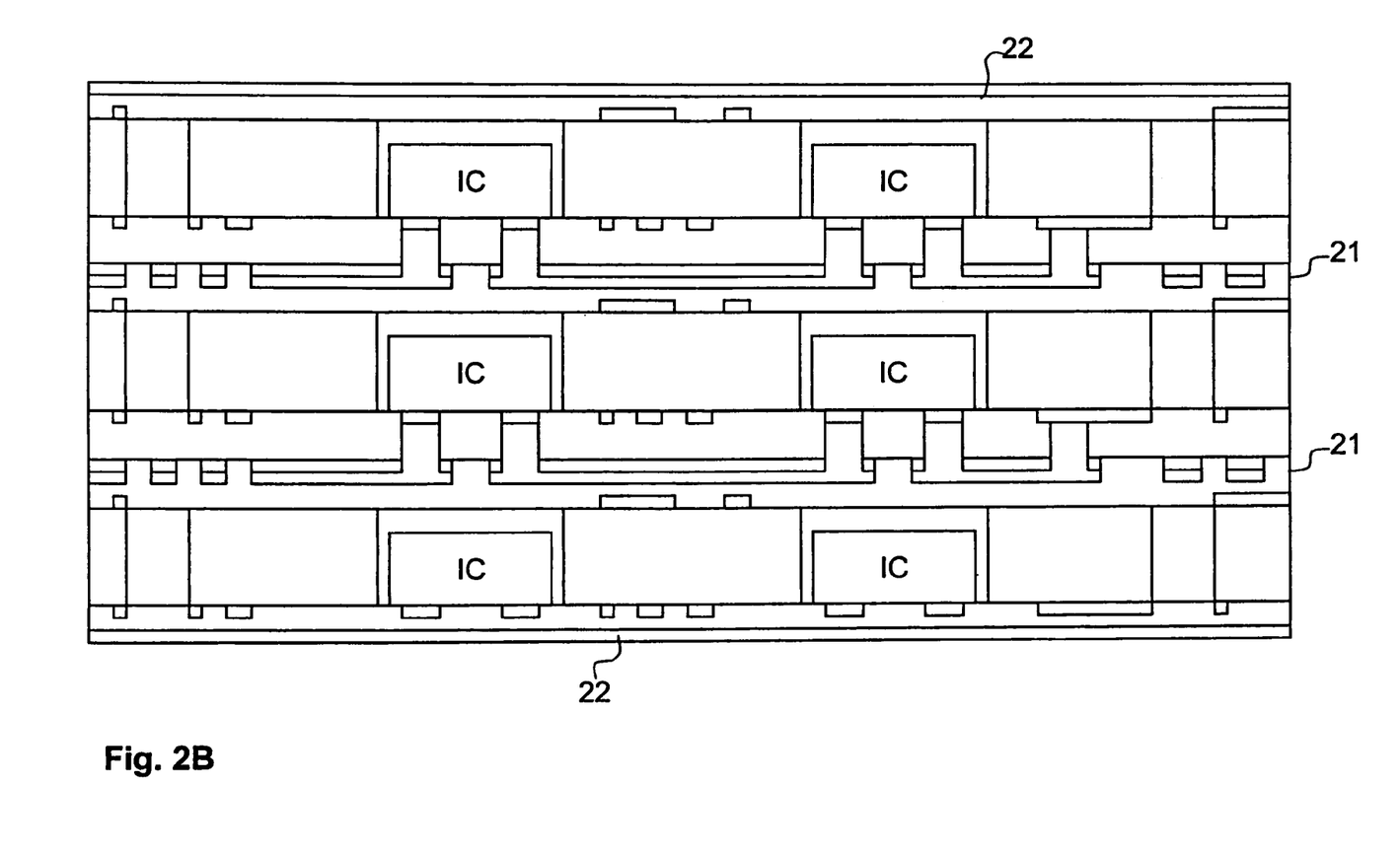

Stage 2B (FIG. 2B):

In stage 2B, the circuit boards are laminated together with the aid of pre-preg epoxy layers 21. In addition, a metal-coated polymer film 22 is made on the upper surface of the circuit board. The process corresponds to stage J of the process of FIG. 1. In the example process, a metal-coated polymer film 22 is already on the under surface of the circuit board.

Figure 2C:
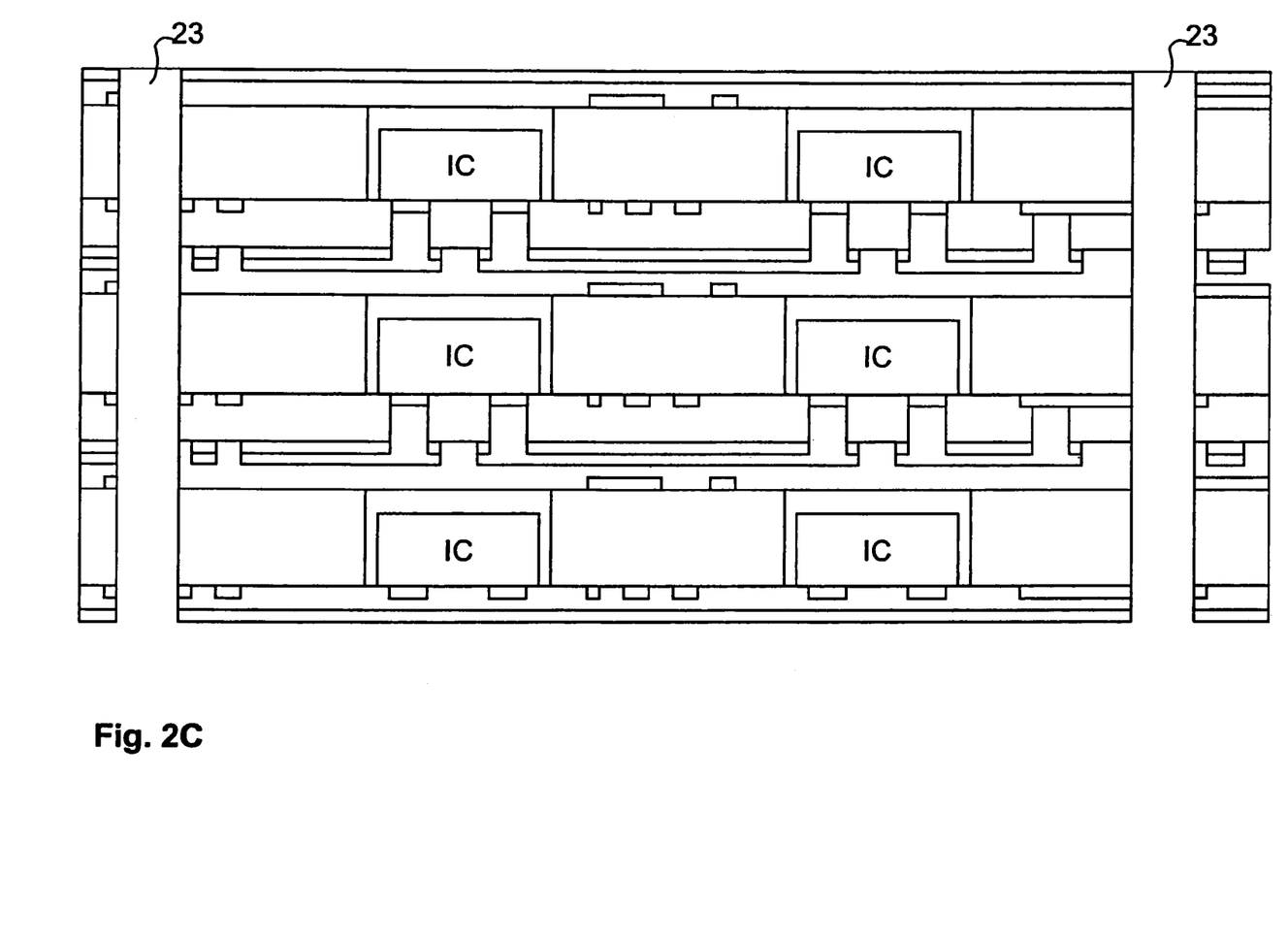

Stage 2C (FIG. 2C):

In stage 2C, holes 23, for the formation of contacts, are drilled in the circuit board.

After Stage 2C, the process can be continued for example as follows:

Stage 2D:

In stage 2D, conductive material is grown on top of the circuit board and in the through holes 23, in the same way as in stage 1C.

Stage 2E:

In stage 2E, the conductive layer on the surface of the circuit board is patterned in the same way as in stage 1D.

Stage 2F:

In stage 2F, a photolithographic polymer is spread on the surfaces of the circuit board and the desired pattern is formed in the polymer in the same way as in stages 1N and 1O. The exposed polymer film is developed, but the polymer film pattern remaining on the circuit board is not removed.

Stage 2G:

In stage 2G, the connection areas of the polymer film pattern formed in the previous stage are metallized in the same way as in stage 1P.

On the basis of the example of FIG. 2, it is obvious that the method can also be used to manufacture many kinds of three-dimensional circuit structures. For example, the method can be used in such a way that several memory circuits are placed on top of each other, thus forming a packet containing several memory circuits, in which the memory circuits are connected to each other to form an operational totality. Such a packet can be termed a three-dimensional multichip module. The chips in such modules can be selected freely and the contacts between the chips can be easily made according to the selected circuits.

Figure 4A:
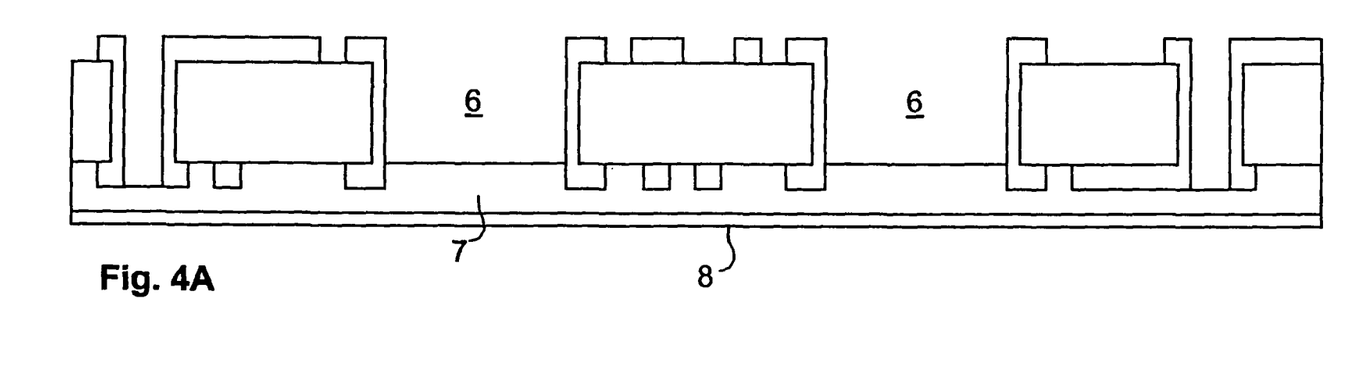
FIG. 4 shows a series of cross-sections of a third process according to the invention.

The invention also permits electromagnetic protection to be made around the component embedded in the base. This is because the method of FIG. 1 can be modified in such a way that the holes 6 depicted in stage 1E can be made in connection with the making of the holes 3 carried out in stage 1B. In that case, the conductive layer 4 to be made in stage 1C will also cover the side walls of the holes 6 made for the components. FIG. 4A shows a cross-section of the base structure as it is after stage 1F in the process modified in the aforesaid manner.

Figure 4B:
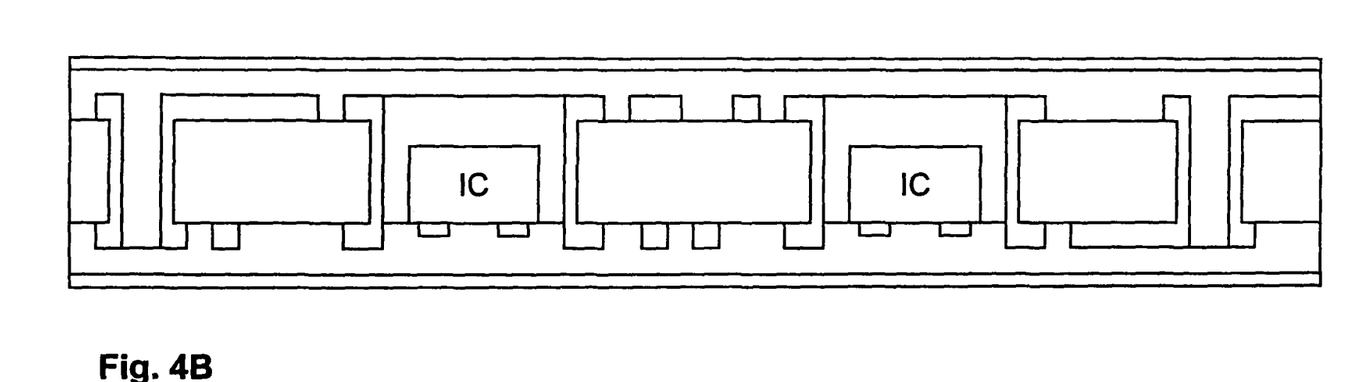

After the intermediate stage shown in FIG. 4A, the process can be continued by assembling the microcircuits in a similar way to stage 1G, the polymer film being hardened as in stage 1H, and the microcircuits being attached similarly to stage 1I. After this, polymer and metal foils can be formed on the first surface of the circuit board similarly to stage 1J. FIG. 4B shows an example cross-section of the base structure after these process stages.

Figure 4C:
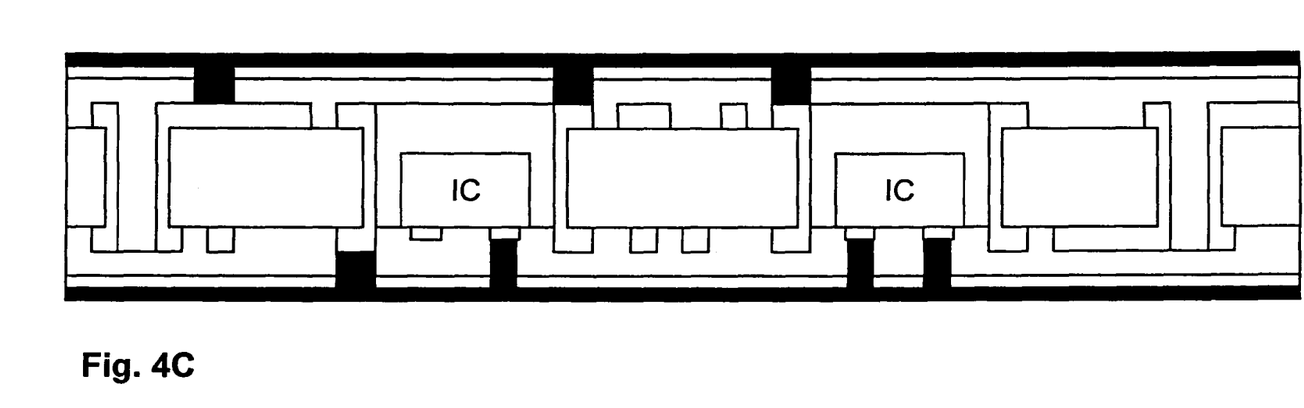

After the intermediate stage shown in FIG. 4B, the process can be continued by making holes, similar to those of stage 1K, in the polymer film, for making contacts. After this, a conductive layer is made in the holes and on the surfaces of the board similarly to stage 1L. FIG. 4C shows an example cross-section of the base structure after these process stages. For reasons of clarity, the conductive layer made similarly to stage 1L in the holes and on the board surfaces is highlighted in black.

Figure 4D:
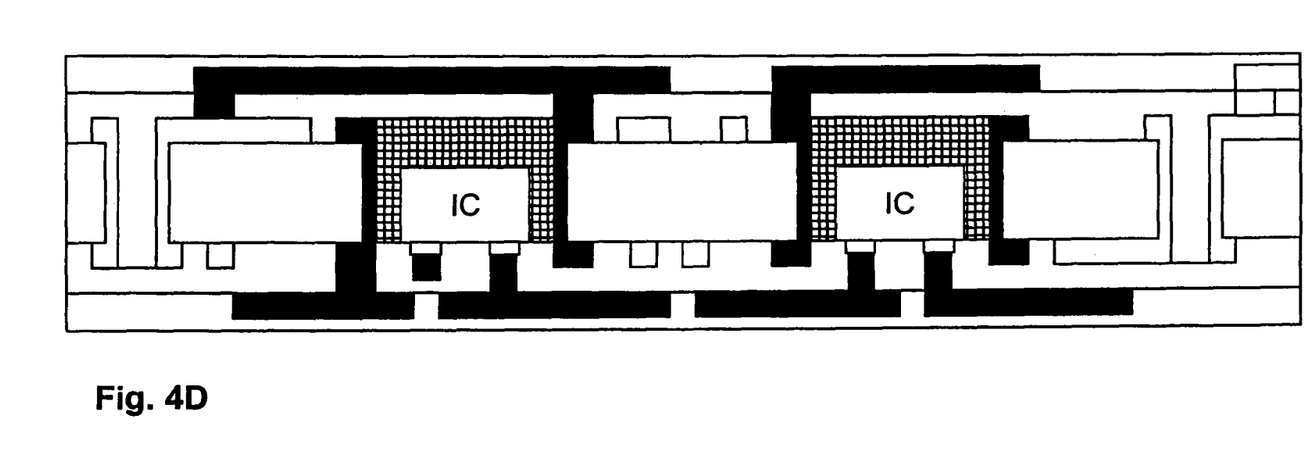

After the intermediate stage shown in FIG. 4C, the process can be continued by patterning a conductive layer on the surfaces of the board as in stage 1M and by coating the surfaces of the board as in stage 1N. After these stages, the microcircuits are surrounded by a nearly unbroken metal foil, which forms an effective protection against interference caused by electromagnetic interaction. This construction is shown in FIG. 4D. After the intermediate stage shown in FIG. 4D, stages corresponding to stages 1O and 1P are carried out, in which a protective foil and connections are made on the surface of the circuit board.

In FIG. 4D, the cross-sections of the metal layers protecting the microcircuits are highlighted in black. In addition, the background of the microcircuits is highlighted with cross-hatching. The cross-hatching is intended to be a reminder that all the sides of a hole made for a microcircuit are covered by a metal foil. Thus the microcircuit is surrounded laterally with an unbroken metal foil. In addition to this, a metal plate can be designed above the microcircuit, which is made in connection with the making of the circuit board's conductive pattern. Similarly, a metal foil that is as complete as possible is made below the microcircuit. The making of contacts below the microcircuit means that small gaps must be made in the metal foil, as shown in FIG. 4D, for instance. These gaps can, however, be made so narrow laterally, or, correspondingly, so thin vertically, that they do not weaken the protective effect obtained against electromagnetic interference.

When examining the example of FIG. 4D, it must also be take into account that the final structure also contains parts extending at right angles to the plane shown in the figure. Such a structure extending at right angles is shown by the conductor connected to the contact bump on the left-hand side of the left-hand microcircuit of FIG. 4D, which runs towards the viewer from between the metal foil surrounding the microcircuit laterally and the conductive layers below the microcircuit.

The solution shown by FIG. 4D thus provides the microcircuit with excellent protection against electromagnetic interference. As the protection is made immediately around the microcircuit, the construction also protects against mutual interference arising between the components contained in the circuit board. Most of the electromagnetic protective structure can also be earthed, as the metal foil surrounding the microcircuits laterally can be connected electrically to the metal plate above the circuit. The connections of the circuit board, can, in turn, be designed in such a way that the metal plate is earthed through the conductive structure of the circuit board.

The invention claimed is:

1. A circuit board, comprising:
   an insulating material layer including a baseboard and a hardened insulating polymer layer;
   conductive patterns on both sides of the insulating material layer;
   at least one microcircuit comprising a first surface and having contact areas on the first surface, the at least one microcircuit being inside the insulating material layer in a hole in the baseboard and having the first surface against the hardened insulating polymer layer;
   conductive material on sidewalls of the hole in the baseboard, in order to create interference protection around the microcircuit; and
   contact openings in the hardened insulating polymer layer and copper in the contact openings for forming electrical contacts between the contact areas of the microcircuit and at least one of the conductive patterns, wherein the copper contains at least one of electrochemically deposited copper and chemically deposited copper.

2. The circuit board of claim 1, wherein the hardened insulating polymer layer contains epoxy.

3. The circuit board of claim 2, wherein the hardened insulating polymer layer contains epoxy and glass fibres.

4. The circuit board of claim 3, wherein the baseboard is a glass-fibre reinforced epoxy board.

5. The circuit board of claim 1, wherein the microcircuit is located between said conductive patterns on both sides of the insulating material layer.

6. The circuit board of claim 1, wherein the microcircuit is secured in place in the hole with a filler material in the hole.

7. The circuit board of claim 6, wherein the filler material contains epoxy.

8. The circuit board of claim 1, wherein
   said at least one microcircuit comprises several microcircuits inside the insulating material layer, the microcircuits comprising first surfaces and contact area on their first surfaces, the first surfaces of the microcircuits being against the hardened insulating polymer layer; and
   the microcircuits are connected to each other in order to form an operational totality by means of the conductors in the contact opening and at least one of the conductive patterns.

9. The circuit board of claim 1, wherein the copper in the contact openings contains a first layer of chemically deposited copper and a second layer of electrochemically deposited copper on the first layer of chemically deposited copper.

10. The circuit board of claim 1, comprising an electrically conducting feed-through between the conductive patterns on the both sides of the insulating material layer.

11. The circuit board of claim 1, wherein
    said at least one microcircuit comprises several microcircuits embedded in the insulating material layer, and
    said conductive patterns connect the embedded microcircuits to each other in order to form an operational totality.

12. A multi-layered circuit board, which includes at least two circuit board substructures on top of each other, at least one of said circuit board substructures comprising:
    an insulating material layer including a baseboard and a hardened insulating polymer layer;
    conductive patterns on both sides of the insulating material layer;
    at least one microcircuit embedded in the insulating material layer, the embedded microcircuit having contact areas on its first surface and the first surface of the microcircuit being against the hardened insulating polymer layer, the at least one microcircuit being inside the insulating material layer in a hole in the baseboard and having the first surface against the hardened insulating polymer layer; and
    contact openings in the hardened insulating polymer layer and copper in the contact openings for forming electrical contacts between the contact areas of the microcircuit and at least one of the conductive patterns, wherein the copper contains at least one of electrochemically deposited copper and chemically deposited copper.

13. The multi-layered circuit board of claim 12, wherein said at least two circuit board substructures on top of each other are electrically connected to each other to form a multi-layered functioning totality.

14. The multi-layered circuit board of claim 13, wherein said at least one microcircuit comprises at least two microcircuits.

15. The multi-layered circuit board of claim 13, wherein said at least two circuit board substructures each comprise at least one memory circuit.

16. The multi-layered circuit board of claim 13, comprising at least three circuit board substructures on top of each other and electrically connected to each other.

17. The multi-layered circuit board of claim 12, wherein at least two of said circuit board substructures each comprise an insulating material layer including a baseboard and a hardened insulating polymer layer, conductive patterns on both sides of the insulating material layer, at least one microcircuit embedded in the insulating material layer, the embedded microcircuit having contact areas on its first surface and the first surface of the microcircuit being against the hardened insulating polymer layer, and contact openings in the hardened insulating polymer layer and copper in the contact openings for forming electrical contacts between the contact areas of the microcircuit and at least one of the conductive patterns, wherein the copper contains at least one of electrochemically deposited copper and chemically deposited copper.

18. The multi-layered circuit board of claim 12, wherein said at least two circuit board substructures on top of each other comprises a first circuit board substructure and a second circuit board substructure, the first and second circuit board substructures being electrically connected to each other to form a multi-layered functioning totality.

19. The multi-layered circuit board of claim 18, wherein said first circuit board substructure comprises an insulating material layer including a baseboard and a hardened insulating polymer layer, conductive patterns on both sides of the insulating material layer, at least one microcircuit embedded in the insulating material layer, the embedded microcircuit having contact areas on its first surface and the first surface of the microcircuit being against the hardened insulating polymer layer, and contact openings in the hardened insulating polymer layer and copper in the contact openings for forming electrical contacts between the contact areas of the microcircuit and at least one of the conductive patterns, wherein the copper contains at least one of electrochemically deposited copper and chemically deposited copper.

20. The multi-layered circuit board of claim 19, wherein said second circuit board substructure comprises an insulating material layer including a baseboard and a hardened insulating polymer layer, a conductive pattern on the insulating material layer, at least one microcircuit embedded in the insulating material layer, the embedded microcircuit having contact areas on its first surface and the first surface of the microcircuit being against the hardened insulating polymer layer, and contact opening in the hardened insulating polymer layer and copper in the contact openings for forming electrical contacts between the contact areas of the microcircuit and the conductive pattern, wherein the copper contains at least one of electrochemically deposited copper and chemically deposited copper.

21. The multi-layered circuit board of claim 20, wherein the hardened insulating polymer layers of both the first and second circuit board substructures contain epoxy.

22. The multi-layered circuit board of claim 20, wherein the baseboards of both the first and second circuit board substructures are glass-fibre reinforced epoxy boards.

23. The multi-layered circuit board of claim 19, wherein the at least one microcircuit of the first circuit board substructure is located between said conductive patterns on both sides of the insulating material layer of the first circuit board substructure.

24. The multi-layered circuit board of claim 12, wherein the copper in the contact openings contains a first layer of chemically deposited copper and a second layer of electrochemically deposited copper on the first layer of chemically deposited copper.

25. The multi-layered circuit board of claim 20, wherein at least one of said first and second circuit board substructures comprises a metal plate above at least one of the microcircuits.

26. The multi-layered circuit board of claim 20, wherein at least one of said first and second circuit board substructures comprises a metal foil below at least one of the microcircuits.

27. A multi-layered circuit board, which includes at least two circuit board substructures on top of each other, at least two of said circuit board substructures each comprising:

an insulating material layer including a baseboard and a hardened insulating polymer layer;

conductive patterns on both sides of the insulating material layer;

at least one microcircuit embedded in the insulating material layer, the embedded microcircuit having contact areas on its first surface and the first surface of the microcircuit being against the hardened insulating polymer layer; and contact openings in the hardened insulating polymer layer and copper in the contact openings for forming electrical contacts between the contact areas of the microcircuit and at least one of the conductive patterns, wherein the copper contains at least one of electrochemically deposited copper and chemically deposited copper, and at least one of said at least two circuit board substructures further comprises a metal foil below at least one of the microcircuits.

28. The circuit board of claim 1, wherein all the sidewalls of the hole in the baseboard are covered by a metal foil as the conductive material.

29. The circuit board of claim 28, wherein the metal foil is an unbroken metal foil and surrounds the microcircuit in a lateral direction of the circuit board.

30. The circuit board of claim 1, comprising a metal plate above the microcircuit.

31. The circuit board of claim 1, comprising a metal plate below the microcircuit.

32. The circuit board of claim 1, comprising a metal plate above and below the microcircuit.

33. The circuit board of claim 28, comprising a metal plate above and below the microcircuit.

* * * * *